United States Patent
Ottobon et al.

(12) 
(10) Patent No.: US 10,282,652 B2
(45) Date of Patent: May 7, 2019

(54) METHOD FOR PRODUCING A SINGLE-SIDED ELECTRONIC MODULE INCLUDING INTERCONNECTION ZONES

(71) Applicant: GEMALTO SA, Meudon (FR)

(72) Inventors: Stéphane Ottobon, Gemenos (FR); Lucile Dossetto, Gemenos (FR); Luc Charles, Gemenos (FR); Thierry Laviron, Gemenos (FR)

(73) Assignee: GEMALTO SA, Meudon (FR)

( * ) Notice: Subject to any disclaimer, the term of this patent is extended or adjusted under 35 U.S.C. 154(b) by 0 days.

(21) Appl. No.: 15/531,159

(22) PCT Filed: Feb. 9, 2016

(86) PCT No.: PCT/EP2016/052744
§ 371 (c)(1),
(2) Date: May 26, 2017

(87) PCT Pub. No.: WO2016/131682
PCT Pub. Date: Aug. 25, 2016

(65) Prior Publication Data
US 2017/0372186 A1 Dec. 28, 2017

(30) Foreign Application Priority Data
Feb. 20, 2015 (EP) .................................... 15305271

(51) Int. Cl.
*G06K 19/077* (2006.01)
(52) U.S. Cl.
CPC . *G06K 19/07754* (2013.01); *G06K 19/07747* (2013.01); *G06K 19/07769* (2013.01);
(Continued)

(58) Field of Classification Search
CPC ............. G06K 7/0008; G06K 19/0723; G06K 19/07749; G06K 7/10366; G06K 7/10336; G06K 2017/0045; G06K 7/10079
(Continued)

(56) References Cited

U.S. PATENT DOCUMENTS

| 5,598,032 A | 1/1997 | Fidalgo |
| 2012/0193436 A1* | 8/2012 | Sutera .............. G06K 19/07769 235/492 |

FOREIGN PATENT DOCUMENTS

| EP | 2420960 A1 | 2/2012 |
| EP | 2 575 086 A1 | 4/2013 |

(Continued)

OTHER PUBLICATIONS

International Search Report (PCT/ISA/210) dated Apr. 13, 2016, by the European Patent Office as the International Searching Authority for International Application No. PCT/EP2016/052744.
(Continued)

*Primary Examiner* — Mark S Blouin
(74) *Attorney, Agent, or Firm* — Buchanan Ingersoll & Rooney PC

(57) ABSTRACT

The invention relates to a method for producing a module having an electronic chip including metallizations which are accessible from a first side of the metallizations and an integrated circuit chip which is arranged on the second side of the metallizations, opposite the first side. The method comprises the step of forming electrical interconnection elements which are separate from the metallizations, directly connecting the chip, and are arranged on the second side of the metallizations. The invention also relates to a module corresponding to the method and to a device comprising said module.

22 Claims, 3 Drawing Sheets

(52) U.S. Cl.
CPC ............... *H01L 2224/48228* (2013.01); *H01L 2224/49171* (2013.01); *H01L 2224/73265* (2013.01); *H01L 2224/8592* (2013.01)

(58) Field of Classification Search
USPC ...................................................... 340/12.51
See application file for complete search history.

(56) References Cited

FOREIGN PATENT DOCUMENTS

| | | |
|---|---|---|
| FR | 2998395 A1 | 5/2014 |
| JP | 8107123 A | 4/1996 |
| JP | 2011170525 A | 9/2011 |
| JP | 201243341 A | 3/2012 |

OTHER PUBLICATIONS

Written Opinion (PCT/ISA/237) dated Apr. 13, 2016, by the European Patent Office as the International Searching Authority for International Application No. PCT/EP2016/052744.

Notice of Reasons for Rejection dated Apr. 3, 2018 in corresponding JP Patent Application No. 2017-535646.

\* cited by examiner cross section A-A

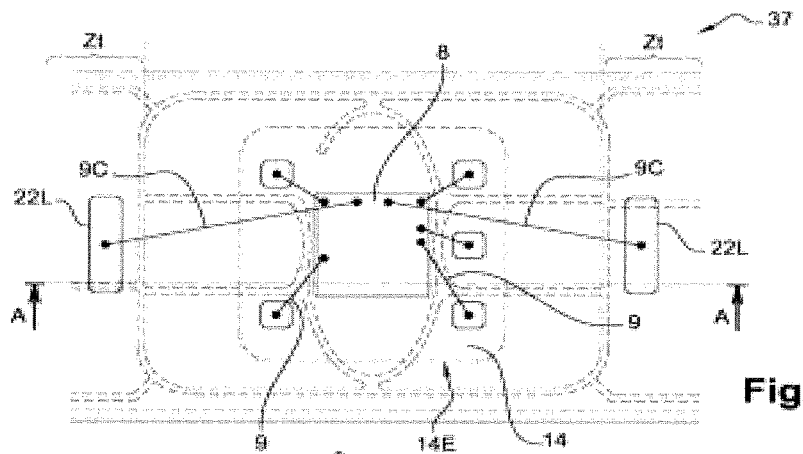
Fig. 4
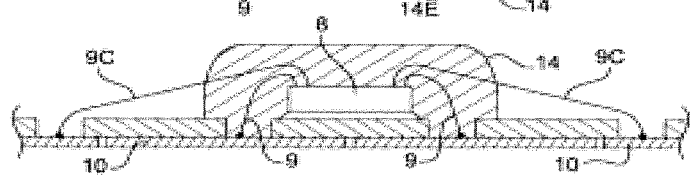
Fig. 5
cross section A-A
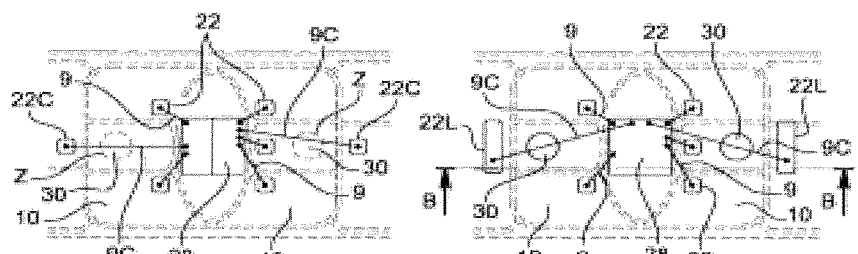
Fig. 6  Fig. 7
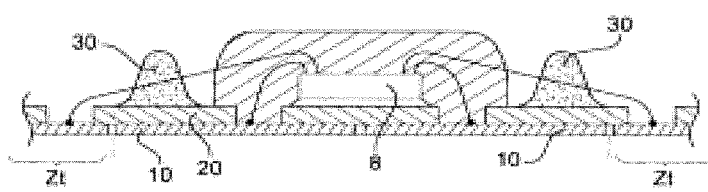
Fig. 8
cross section B-B

METHOD FOR PRODUCING A SINGLE-SIDED ELECTRONIC MODULE INCLUDING INTERCONNECTION ZONES

FIELD OF THE INVENTION

The invention relates to a method for manufacturing an electronic-chip module comprising metallisations (or electrical contact pads) accessible on a first side of the metallisations and an integrated-circuit chip disposed on the second side of the metallisations, opposite to the first side.

The module is preferably intended to be interconnected electrically with interconnection terminals disposed in a device support body.

The invention relates in particular to an electronic-chip device such as a smartcard comprising such a module. Such a device may comprise various electronic components such as for example a display, a keypad, a battery, etc. These devices may generate functions such as the generation of a single-use number (OTP), making it possible to display the last banking transactions made, while associating standard functions of the payment, transport, identification, etc type.

The invention also relates to the field of electronic media such as smartcards of the contact and/or contactless type or hybrid cards, radio-frequency tickets, or tags, radio-frequency transponders, or inserts (or inlays) integrating or constituting such a module.

Such media or devices with electronic chip may in particular be in accordance with ISO/IEC 14443 or ISO 78016.

The words "electrical circuit" mean all or part of elements conducting electric current, in particular electrical contact pads, conductive tracks, connections, redirection tracks, electrical pins associated or not with at least one integrated circuit or electronic/electrical component (capacitor, coil, resistor, etc) connected to this electrical circuit. Integrated-circuit chips are those known in the field of smartcards, in particular a dual-interface chip (with and without contact), light emitting diode, audio sensor, microcontroller, communication controller, in particular near field radio-frequency communication.

PRIOR ART

The U.S. Pat. No. 5,598,032 describes a method for assembling a module intended to be connected to an antenna embedded in a support body of a hybrid smartcard (with and without contact). Providing a cavity in the support body is known, so as to make the connection areas of the antenna accessible for connection with the module when it is transferred into the cavity. Conductive interconnection elements of all kinds may connect connection zones of the module disposed outside the enrobing and the connection areas of the antenna.

Moreover, manufacturing a smart-card module by the following steps is known:
producing conductive tracks or pads (or metallisations) on the two opposite faces of a continuous dielectric or insulating support,
transferring and fixing by its rear face at least one integrated-circuit chip on the support or the pads,
connection, in particular by soldered wire, of the chip to conductive contact pads disposed on an external face of the module and to interconnection pads disposed on an internal face of the module,
enrobing of at least the chip and/or its connections with a protective resin in an enrobing zone around the chip,
deposition of conductive glue on these interconnection pads for connection to an antenna disposed in a card body,
cutting and transferring the module into a cavity of the card body so as to connect interconnection terminals disposed in the card body belonging in particular to a radio-frequency antenna.

The document US 2012/193436 A1 describes a method for manufacturing a hybrid chip card comprising a module of the type with contacts and without contacts. The module is of the double-face type with metallisations on the two opposite faces of an insulating substrate. The chip is directly connected to the metallisations by soldered conductive wire.

The document EP 2575086 A1 describes a method for connecting a hybrid chip card module (contacts and contactless) to conductive zones embedded in a support. The double-face module comprises metallisations on the two opposite faces of an insulating substrate. Ends of metallisations situated on the concealed face of the module are folded over by mechanical deformation towards conductive zones and conductive glue after insertion of the module through orifices emerging on the surface of the module.

TECHNICAL PROBLEM

Double-faced modules used in smartcards of the hybrid type (contact and contactless) require expensive metallisations, in particular by electrochemical etching on the two opposite main faces of a dielectric support film.

SUMMARY OF THE INVENTION

The invention proposes, in a preferred embodiment, to use and configure/adapt a single-face metallised module for producing interconnection zones.

The module can connect interconnection terminals disposed in particular in a support body via these interconnection zones formed according to the invention.

The subject matter of the invention is therefore a method for manufacturing an electronic-chip module comprising metallisations accessible from the outside of a first side of the metallisations and an integrated-circuit chip disposed on the second side of the metallisations, opposite to the first side, characterised in that it comprises the step of forming electrical interconnection elements (9C, 19C, 30), distinct from the metallisations, directly connecting the chip and disposed on the second side of the metallisations.

In other words, the interconnection elements may extend or pass over/above/along an interconnection zone "Z".

Thus the invention makes it possible to dispense with a double-sided module. Interconnection elements directly connecting the chip are all the same formed on the same side as the second face of the module (the concealed face) but with a much more economical connection/redirection technology such as soldered wire.

In particular, the interconnection elements extend outside the periphery of the module and the elements are subsequently cut.
One end of these interconnection elements (in particular in the form of wires) can directly connect a pin of the chip by soldering while the other end is soldered to metal conductive pads (or metallisations) situated outside the limit of the module, through an orifice (or connection well) provided in a dielectric substrate supporting the metallisations.

The method comprises a step of at least partial enrobing of the chip with an enrobing material and/or adhesive with the exception of at least one portion of the interconnection elements.

The method comprises a step of forming interconnection pins made from conductive material in the interconnection zone (Z) so as to trap/electrically contact a portion of at least one interconnection element.

The method comprises a step of cutting the interconnection element during the step of extraction/cutting of the module from the strip.

Thus the invention makes it possible to easily form interconnection elements that are sufficiently rigid/mechanically stable for holding thereof in position in an interconnection zone Z before connection.

Another subject matter of the invention is a method for the manufacture of an electrical and/or electronic device, said device comprising a support body and a module obtained according to any of the preceding claims fixed to the support body; it is characterised in that it comprises the following steps of:

formation of a support body having said terminals of a second circuit accessible in/on the support body, transfer of the module onto the support body, a first circuit of the modules connecting said terminals of the second circuit.

Another subject matter of the invention is a module and device corresponding to the method.

In particular, its subject matter is an electronic-chip module comprising metallisations accessible on a first side of the metallisations and an integrated-circuit chip disposed on the second side of the metallisations, opposite to the first side, characterised in that it comprises the step of forming electrical interconnection elements (9C, 19C, 30), distinct from the metallisations, directly connecting the chip and disposed on the second side of the metallisations.

Another subject matter thereof is an electronic module comprising electrical contact pads accessible on a first face of a dielectric substrate and an integrated-circuit chip on the side of a second face opposite to the first face, characterised in that it comprises electrical interconnection elements connecting the chip and extending on/above, along the second face of the substrate.

The device can preferably constitute a smartcard integrating one of the components such as: a display with or without its control circuit, a fingerprint sensor, a sensor for another physical quantity (radiation, temperature, chemical analysis, etc), an energy source (solar cell, energy collection element, primary or rechargeable battery, etc).

The shape factor of the card may be that of an ID0 card, a UICC plug-in, an electronic passport, or a ticket with a thickness less than 0.8 mm.

BRIEF DESCRIPTION OF THE FIGURES

FIGS. 3 and 4 illustrate a step of producing a module in accordance with an embodiment of the method of the invention according to two variants;

FIG. 5 is a view in partial cross section of a module illustrated in one of the previous two figures;

FIGS. 6 and 7 illustrate a step of depositing conductive interconnection material on the modules in FIGS. 3 and 4;

FIGS. 8 and 9 illustrate respectively a step of depositing conductive interconnection material and a step of cutting/extracting the module from a support strip according to a preferred embodiment of the method of the invention;

DESCRIPTION

Figure 1:
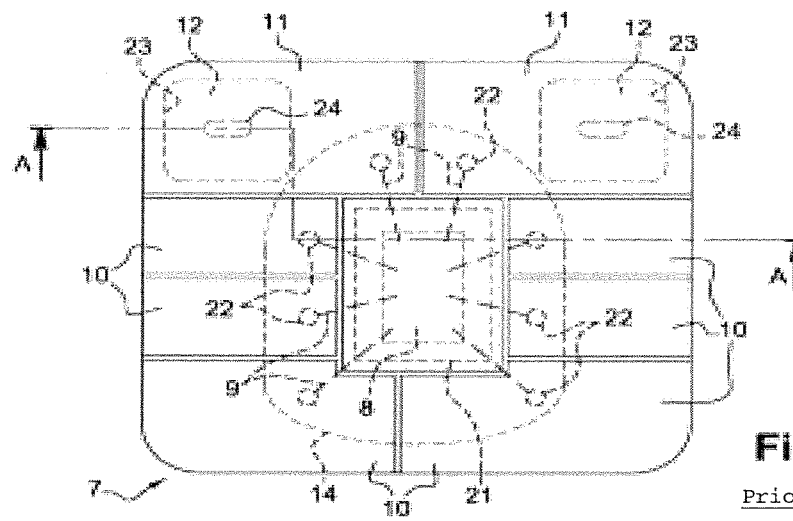
FIGS. 1 and 2 illustrate a smartcard module of the prior art respectively in plan view and in cross section.
Figure 2:
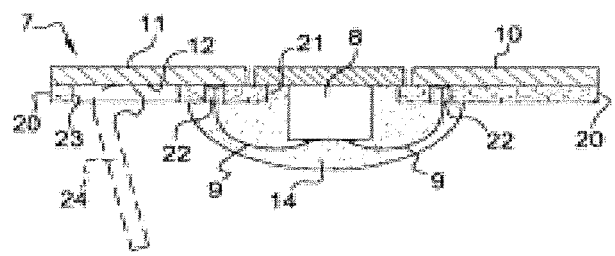

FIGS. 1 and 2 illustrate a hybrid integrated-circuit smartcard module 7 of the prior art. It comprises contact pads 10, 11 on a dielectric or insulating support 20 in particular of the LFCC (lead frame chip carrier) type, at least one integrated-circuit chip 8 transferred onto the support 20 or here onto a metal pad, for contact or not. The contact pads are intended to connect a smartcard reader connector.

The module also comprises connections 9 for in particular connecting contact pads by soldered wires, by conductive glue or the like, a chip being able to be turned over (flip-chip) or not. It comprises an enrobing of the chip and/or of its connections with a protective material 14 such as a resin (glob-top), which can be deposited for example in drop form or deposited by overmoulding.

The connections 9 connect the contact pads through orifices 22 formed in the insulating support.

The bottom surface of the module extending substantially from the edge of the enrobing as far as the edge of the module can constitute a surface for bonding the module to a surface of a cavity provided in the card body.

The module also comprises connection means 24 for connecting an antenna embedded in a card body (not shown) receiving the module. These means 24 connect two conductive pads 11 of the module through two orifices 23 situated in the surface bonding the module to the card body or at least outside the protective material 14. These two pads 11 are connected to the radio-frequency pins of the chip, here by soldered wires through orifices 23.

Figure 3:
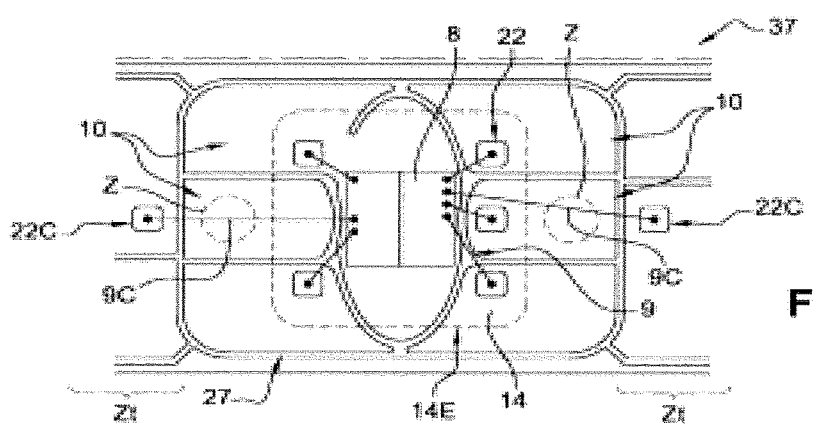

FIGS. 3 and 4 illustrate a step of producing a module 27 with chip 8 according to a first embodiment with two variants.

According to one feature of a preferred method for manufacturing a device comprising an electronic-chip module (17) according to the invention, the method comprises a step of producing metallisations (or electrical contact pads) accessible from a first side of the metallisations. Here metallisations are produced on a first face of a dielectric substrate. The method also comprises a step of transferring an integrated-circuit chip onto the second side of the metallisations, opposite to the first side. The elements may extend over/above/along the metallisations (the case of metallisations with dielectric or metallisations supported by a dielectric perforated at the contact pads, the metallisations being behind the dielectric substrate on the same side as the chip intended to be buried in a card body). When a dielectric substrate is present, the interconnection elements may extend along/over/above the dielectric on the second side opposite to the first side of the metallisations. The elements may therefore extend over/above/along the metallisations or a dielectric substrate according to circumstances. Here, in the example, the chip is disposed on the same side as a second dielectric face opposite to the first face. The chip is in principle connected to the contact pads (or metallisations) by soldered wires.

The same references from one figure to another indicate identical or similar means. The module is formed on a strip 37 of insulating dielectric film comprising metallisations defining a plurality of module locations. The metallisations are laminated or etched in a known fashion on a face of the dielectric. Alternatively, the module may be formed on a sheet of dielectric film instead of a strip.

The module 27 with integrated-circuit or electronic chip 8 may be substantially of the same type as in the previous figures with the exception of interconnection elements extending from the chip towards the periphery of the module and separate from the first metallisation.

It comprises here a substrate 20 a preferably a protective material 14 at least partially enrobing the electronic circuit 28 in an enrobing zone 14E. The enrobing zone 14E is surrounded by a peripheral surface 14C for fixing the module or for bonding.

The electronic chip 28 connects contact pads 10 through orifices 22 by any known means and in this case by soldered wires.

The chip 8 preferably fulfils functions of communication with a contact and contactless reader. It comprises pins for ISO 7816 contact-type communication and two pins for contactless communication.

However, the chip may make an interconnection with a circuit other than an antenna disposed in a support body such as a display, a keypad, a switch, etc.

The chip is mounted here normally on the module by having its rear face fixed to the module as in FIG. 1. Its active face carrying its electrical connection pins is oriented towards the outside of the module.

In a variant of the invention, the absence of a substrate 20 can be envisaged, the pads or metallisations then being held together via an enrobing or a resin.

According to one feature, the method comprises the step of forming electrical interconnection elements (9C, 19C, 30) connecting the chip and extending over/above the second face of the substrate or metallisations without electrically connecting the metallisations at least in the bonding zone of the module (situated at the periphery of the enrobing).

In the example, FIGS. 3 and 4, the interconnection elements according to the preferred mode are produced in the form of conductive soldered wires 9C. One end of these wires directly connects a pin of the chip 8 by soldering while the other end is soldered to contact pads (or metallisations) situated outside the limit of the module 27, through an orifice (or connection well) 22C, 22L provided in the dielectric substrate.

The elongate soldering wells 22L make it possible to use a greater variety of configuration of chip pins.

According to a feature of one embodiment, the interconnection elements 9C, 19C extend in the direction of or outside the periphery 27 of the module; these interconnection elements are cut subsequently in particular to the cutting of the module from its reel support strip 37.

In the example, the soldered wires 9C of the contactless pins extend beyond the finite limit of the module 27 in order to be soldered in wells 22C situated outside the limit of the module. This zone Zt outside the zone of the module 27 corresponds to a working or current-feed zone particular to the module strip 37.

According to a preferred feature, the method may comprise a step of at least partial enrobing of the chip, with an enrobing material with the exception of at least one portion of the interconnection elements (extending in the interconnection zone Z).

In the example in FIGS. 3-5, the chip and its wired connections 9 of the contact type are enrobed. Likewise the starting portions of the contactless communication wires 9C are enrobed. The residual portion extending from the enrobing resin as far as the waiting wells 9C is not enrobed with the insulating enrobing resin.

According to another feature of the preferred embodiment, the method may comprise a step of forming interconnecting pins 30 from conductive material in the interconnection zone so as to trap/electrically contact a portion of at least one interconnection element 9C, in the interconnection zone Z.

In the example in FIGS. 6 and 7, a deposition is effected of at least one drop of conductive material 30 comprising in particular silver particles on top of each conductive wire 9C. Each drop forms a pin resting on the dielectric substrate 20 and extending at a height while trapping and contacting each conductive wire 9C.

The function of the wells 22C or 22L is therefore to fix the wires 9C temporally in position in the interconnection zone, at least during the enrobing step or at least during the formation of the conductive pins. Once the enrobing has been carried out or at least the conductive pin 30 formed, the conductive wires 9C are held mechanically substantially in position on a path passing through an interconnection zone "Z".

This is because, during manipulations of the strips 37 during manufacture, it may happen that the conductive wires 9C not held mechanically move into undesired positions under the effect of the movements or vibrations caused by the movement of the modules from one manufacturing operating gate to another.

As indicated, it is possible to overcome this problem by increasing the number of soldered wires on the same pin and placing a plurality of wire passages in the interconnection zone "Z". In this way the chances of holding at least one wire in the interconnection zone "Z" are increased. The increase in number of the wires on the same chip pin also improves the electrical contact with the silver particles of the pins 30 of conductive material.

Alternatively, generally to fix the end (in principle free) of the interconnection elements, in the case where an insertion adhesive is deposited on the module at least in the module bonding zone, the wires of the interconnection elements 9C can be held by adhesion to the adhesive in particular in the interconnection zone "Z".

According to another feature of the preferred embodiment, the cutting of the interconnection element is carried out during the step of extraction/cutting of the module from the substrate.

Figure 9:
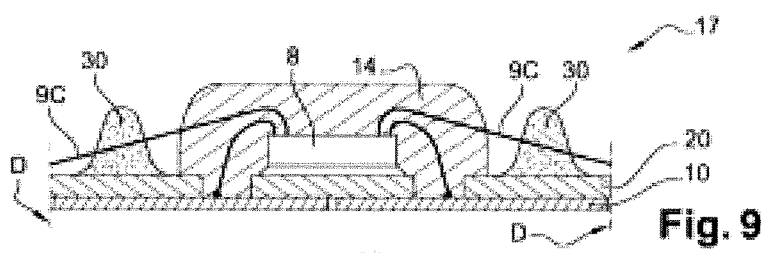

In the example in FIG. 9, the conductive wires 9C are cut (broken line D) during the extraction and transfer of the module.

Figure 9A:
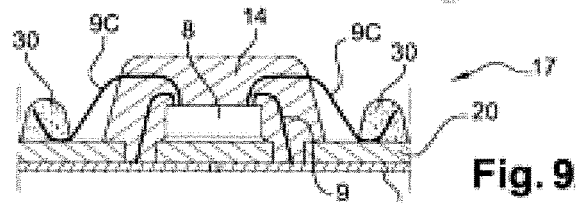
FIGS. 9A and 10 illustrate two variants of the formation of interconnection elements.
Figure 10:
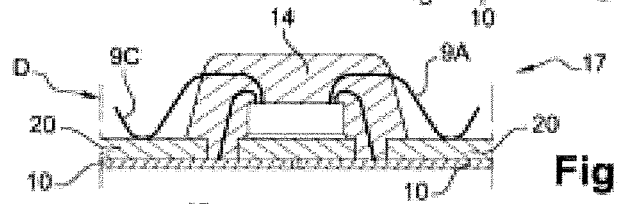

Alternatively, in FIG. 10, the wires can be cut before the extraction of the module, in particular after the formation of the conductive silver pins (FIG. 9A).

Alternatively (FIG. 10), the wires 9C can be formed so as to terminate in or pass through the interconnection zone (Z) without being soldered in a well 22C. Before the enrobing, the wires undergo curvature or bending given by the soldering machine so as to have an end adjoining the surface of the insulating substrate.

The module can thus remain (illustrated in FIG. 10) before interconnection in particular by transfer into an accommodating cavity of a support body; or, as illustrated in FIG. 9A, the module may also and preferably receive conductive interconnection pins 30 formed by the deposition of conductive material. This has the advantage of holding the wires 9C in place and preparing a subsequent interconnection.

In general it is possible to use more rigid conductive wires or interconnection elements, in particular in the form of a blade, or by duplicating or tripling the wires 9C on the same pin (not shown).

Figure 12:
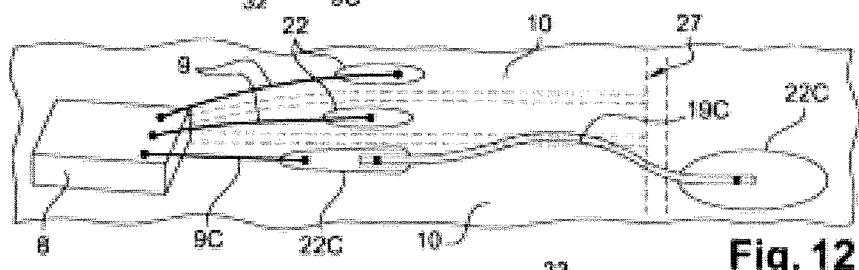
FIG. 12 illustrates a variant embodiment of interconnection elements with conductive flexible blades.

Thus, for example, as illustrated in FIG. 12, it is possible to use interconnection elements in the form of a conductive layer/blade for greater rigidity or mechanical strength. These conductive layers may for example be 0.05 mm to 0.5 mm wide.

A conductive strip may be directly soldered to a conductive bump formed on a contactless pin of the chip. The other end of the strip may be held in the air or be soldered or fixed outside the zone of the module. A cutting of this fixed strip outside the zone of the module may occur subsequently at the same time as the cutting/extraction of the module of the continuous support (lead frame).

In FIG. 12, a flexible blade 19C connects the chip via a first electrical connection relay well 22C (preferably situated in an enrobing zone for receiving a protective material (resin)) adjacent to a peripheral bonding zone of the module and interconnection zone "Z". A blade is soldered by its ends to two wells 92C (accessing metallisations 10) situated respectively in the zone 27 of the module and outside the zone 27 of the module.

Where applicable, each blade (with a cross section two to ten times wider than the diameter of a soldered wire) may be directly connected to a chip pin. The pin of the chip is typically 50 µm to 100 µm in size. These blades/strips have dimensions of between 0.1 mm to 0.5 mm and may be soldered to a bump previously produced on the pin. Thus the electrically conductive blade (or electrically conductive strip) that is wider can connect this small pin.

Preferably, the blade is placed (or even lightly bonded) to the dielectric in the vicinity of the base of the chip. An interconnection wire can connect a chip pin by soldering and each blade also by soldering, to the base of the chip. The other end of the blade may be fixed by soldering to a relay or working pad in a well 22C outside the surface of the module. This end will subsequently be cut with the extraction of the module for insertion thereof.

The connection of the soldered wire to a blade can preferably be enrobed with enrobing material 14 for better strength and mechanical protection of the assembly. The blade 19C is held in position mechanically by virtue of the enrobing 14 and/or optional adhesion of an end on the dielectric in the immediate vicinity of the chip in the zone 14E.

The latter embodiment avoids having relay conductive islands in the wells 22C (a source of short-circuit accessible from the outside) formed in the metallisations 10.

Alternatively, the conductive wires 9C may be fixed to the dielectric substrate itself by thermocompression or thermoadhesion. The substrate may have a surface cladding offering an adhesive property in order to make the wire 9C or blade 19C adhere.

Thus the wire may be held in place in the interconnection zone without having to be extended outside the zone 27 of the module.

Figure 11:
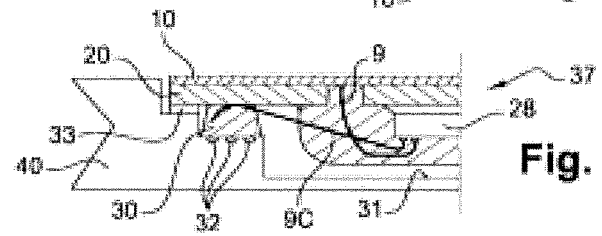
FIG. 11 illustrates a transfer and connection of the module with interconnection terminals disposed in a support body.

According to one feature of the preferred embodiment of the invention, the module is connected to the connection terminals 32 of a support body during the fixing of the modules in the support body 40 (FIG. 11).

In FIG. 11, the module is illustrated in position in a cavity of a support body, in this case a smartcard body.

The conductive pin 30 of the module electrically contacts, by resilient deformation, end portions 32 of an electrical circuit (here an antenna) situated in the support body 40. The electrical connection is made by simple transfer of the module into the cavities 33 and 31. The module is fixed by an adhesive 33.

The invention provides a method for manufacturing an electrical and/or electronic device comprising the previously described module.

The device may comprise a support body 40 provided with at least one cavity 31, 33 provided in the support body, and the module is fixed in the cavity.

It is possible first to form a support body 40 having terminals of a second circuit 32 incorporated in the support body and at least one cavity 31, 32 provided above the connection terminals 32 of the second circuit so as to reveal said terminals 32 or to make them accessible.

Next, the module is transferred into the cavity, which connects the terminals of the second circuit.

Figure 13:
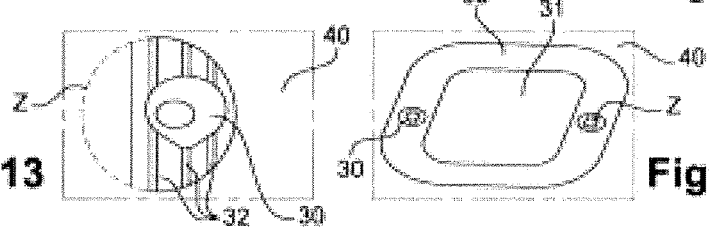
FIGS. 13 and 14 illustrate respectively the deposition of conductive material on end portions of conductive tracks in a cavity of a support body before transfer and connection of a module according to another electrical interconnection mode.
Figure 14:
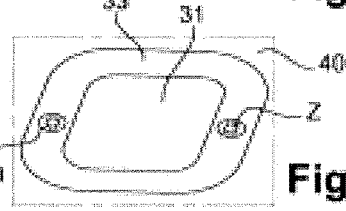

Alternatively (FIGS. 13 and 14), conductive material is deposited on end portions 32 of the support body situated in a cavity of the support body 32, 32.

The module transferred into the cavity 31, 33 may be in accordance with any of the embodiments described previously. The module comprises interconnection zones Z comprising conductive interconnection elements 9C, 19C, 30 held in this zone either alone (being connected to the chip) or by being captive in a conductive pin 30 or an enrobing material deposited close by.

The invention thus produces interconnection zones "Z" distinct from the metallisations situated on a first face of the module (in particular those intended to connect a contact card reader). These interconnection zones advantageously use conventional interconnection elements, in particular a conductive wire 9C, identical to those used for connecting the chip to the metallisations of the module.

The chip may also be mounted turned over (flip-chip). Interconnection wires can be welded to metal relay zones or redirection tracks situated in the vicinity of the location of the chip in the zone 14E (outside a zone of bonding of the module in a support body).

The conductive wires 9C may extend from the relay zones towards the periphery of the module while remaining suspended in the air awaiting an interconnection with end portions of a support body.

Preferably, conductive pins 30 trapping these wires as before are formed. Alternatively, conductive blades 19C more rigid than the wires are used in order to remain in the air during the time of an interconnection; it is also possible to solder a plurality 9C of wires on the same relay zone in order to facilitate interconnection.

Where applicable, in normal mounting or in flip-chip mode, the invention makes provision for forming one or more loops starting from a chip pin or a relay pad passing over an interconnection Z and returning to the starting point, for soldering to the chip pin or relay pad.

The loop may receive a conductive material in the form of a pin at the interconnection zone Z.

In this way loops or lugs issuing from the chip pins are produced, which have the advantage of having better mechanical strength than a single wire with a free end in the air.

The mechanical strength of the interconnection elements 9C, 19C is important in order to ensure a good electrical connection (and correct positioning of the interconnection elements) when the module is transferred and connected to terminals of a support body.

Where applicable, the invention makes provision for interconnecting the module with a second circuit formed against or on the insulating substrate 20. The circuit may for example be an antenna formed by printing conductive material.

The module is therefore not necessarily inserted in a support body.

Alternatively, the metallisations may be disposed on one or other face of a dielectric film. In the case where these metallisations are disposed on a rear face of a support film (the face intended to be against a support body), openings make it possible to access these metallisations.

Where applicable, the interconnection elements are produced as previously described but in addition an insulating material is disposed in the interconnection zone Z in order to insulate metallisations situated vertically in line with the conductive wire or conductive blades.

The invention claimed is:

1. A method for manufacturing a module having an electronic chip, comprising:
   metallisations accessible from a first side of the metallisations and an integrated-circuit chip disposed on the second side of the metallisations, opposite to the first side,
   electrical interconnection elements, separate from the metallisations, directly connecting the chip and disposed on the second side of the metallisations,
   wherein the electrical interconnection elements are produced on a single-face module in which the metallisations are provided on only one of two opposite sides.

2. A method according to claim 1, wherein the interconnection elements extend on or above or along an interconnection zone.

3. A method according to claim 1, wherein the interconnection elements extend outside the periphery of the module and wherein the elements are cut subsequently.

4. A method according to claim 1, wherein one end of the interconnection elements directly connects a pin of the chip by soldering while the other end is soldered to conductive pads or metallisations situated outside the limit of the module, through an orifice or connection well provided in a dielectric substrate.

5. A method according to claim 1, further comprising a step of at least partial enrobing of the chip by an enrobing and/or adhesive material with the exception of at least one portion of the interconnection elements.

6. A method according to claim 1, further comprising a step of forming interconnection pins from conductive material in the interconnection zone so as to electrically contact a portion of at least one interconnection element.

7. A method according to claim 1, further comprising a step of cutting the interconnection element while extracting the module from a strip.

8. A method for manufacturing an electrical and/or electronic device, said device comprising a support body and the module obtained according to claim 1, fixed to the support body, wherein the method comprises the following steps of:
   forming a support body having terminals of a second circuit accessible in/on the support body,
   transferring the module onto the support body, a first circuit of the module connecting said terminals of the second circuit.

9. A method according to claim 8, wherein the step of connecting the module to the terminals takes place during fixing of the module to the support body, wherein electrical interconnection elements of the module or interconnection pins connect said terminals of the support body.

10. A method according to claim 9, further comprising a step of depositing conductive material on said terminals or tracks.

11. A method according to claim 8, wherein the interconnection elements are held in place on or above or along an interconnection zone before transferring the module onto the support body.

12. A method according to claim 11, wherein the interconnection elements are held in place by adhesion effected via an adhesive for inserting the module or by thermocompression or thermoadhesion on an adhesive surface of the module.

13. A method according to claim 8, further comprising a step of depositing conductive material on said terminals or tracks before transferring the module onto the support body.

14. A method according to claim 1, wherein the interconnection elements are disposed solely within the periphery of the module.

15. A method according to claim 1, wherein the interconnection elements are held in place on or above or along an interconnection zone by adhesion.

16. A method according to claim 15, wherein the adhesion is effected via an adhesive for inserting the module or by thermocompression or thermoadhesion on an adhesive surface of the module.

17. A method according to claim 1, wherein said circuit comprises an antenna or a display or a keypad or a switch.

18. A module having an electronic chip, comprising:
   metallisations accessible from a first side of the metallisations and an integrated-circuit chip disposed on the second side of the metallisations, opposite to the first side,
   electrical interconnection elements, separate from the metallisations, directly connecting the chip and disposed on the second side of the metallisations,
   wherein the electrical interconnection elements are disposed on a single-face module in which the metallisations are provided on only one of two opposite sides.

19. A module having an electronic chip according to claim 18, comprising electrical contact pads accessible on a first face of a dielectric substrate and an integrated-circuit chip on the same side as a second face opposite to the first face, further comprising electrical interconnection elements connecting the chip and extending over/above/along the second face of the substrate.

20. A device comprising the module according to claim 18.

21. A module according to claim 18, wherein the chip is at least partially enrobed by an enrobing and/or adhesive material and at least one portion of the interconnection elements is unenrobed by the enrobing and/or adhesive material.

22. A method for manufacturing a module having an electronic chip, comprising:
   metallisations accessible from a first side of the metallisations and an integrated-circuit chip disposed on the second side of the metallisations, opposite to the first side,
   electrical interconnection elements, separate from the metallisations, directly connecting the chip to at least one of the metallisations and directly connecting the at least one of the metallisations to at least an other one of the metallisations and disposed on the second side of the metallisations, wherein the method comprises producing the electrical interconnection elements on a single-face module in which the metallisations are provided on only one of two opposite sides.

\* \* \* \* \*